(12) United States Patent
Komori (10) Patent No.: US 6,552,926 B2
(45) Date of Patent: Apr. 22, 2003

(54) MAGNETIC RANDOM-ACCESS MEMORY (75) Inventor: Shigeki Komori, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/096,878

(22) Filed: Mar. 14, 2002

(65) Prior Publication Data

US 2002/0141231 A1 Oct. 3, 2002

(30) Foreign Application Priority Data

Apr. 3, 2001 (JP) .................................... 2001-104074

(51) Int. Cl.[7] .................. G11C 11/00; G11C 11/14; G11C 11/15
(52) U.S. Cl. .................. 365/158; 365/171; 365/173
(58) Field of Search .................. 365/158, 171, 365/173

(56) References Cited

U.S. PATENT DOCUMENTS

| 6,097,625 | A | * | 8/2000 | Scheuerlein | 365/171 |
|---|---|---|---|---|---|
| 6,331,943 | B1 | * | 12/2001 | Naji et al. | 365/158 |
| 6,331,944 | B1 | * | 12/2001 | Monsma et al. | 365/158 |
| 6,359,805 | B1 | * | 3/2002 | Hidaka | 365/171 |
| 6,385,079 | B1 | * | 5/2002 | Tran | 365/158 |
| 6,385,082 | B1 | * | 5/2002 | Abraham et al. | 365/158 |
| 6,392,924 | B1 | * | 5/2002 | Liu et al. | 365/158 |
| 6,404,673 | B1 | * | 6/2002 | Matsui | 365/158 |

FOREIGN PATENT DOCUMENTS

| JP | 10-261287 | 9/1988 |
|---|---|---|
| JP | 11-288585 | 10/1999 |

* cited by examiner

Primary Examiner—Trong Phan
(74) Attorney, Agent, or Firm—Burns, Doane, Swecker & Mathis, LLP (57) ABSTRACT A magnetic random-access memory comprises a semiconductor substrate (1) on which write word lines (2) and bit lines (3) intersecting each other are arranged, TMR elements (7) formed individually in areas of intersection of the write word lines (2) and the bit lines (3), each TMR element (7) being formed by stacking a free-spin layer (4) whose magnetization direction is variable, a fixed-spin layer (6) whose magnetization direction is fixed and an insulator layer (5) placed between the first and second magnetic substance layers, and access transistors (10). The TMR elements (7) are located where word lines (8a) which serve as gates of the access transistors (10) intersect the bit lines (3) so that the word lines (8a) perform the functions of both write and read word lines. This arrangement reduces the complexity involved in creating a multilayer interconnection structure, simplifies the structure and manufacturing processes of the magnetic random-access memory, and enables its miniaturization and a higher level of integration.

13 Claims, 10 Drawing Sheets

"PRIOR ART"

MAGNETIC RANDOM-ACCESS MEMORY

BACKGROUND OF THE INVENTION AND RELATED ART STATEMENT

The present invention relates to a magnetic random-access memory (MRAM) having a magnetic substance structure.

An MRAM is a memory device which utilizes a phenomenon that the resistance to an electric current flowing through a magnetic substance structure varies depending on the direction of electron spin (magnetization direction) in the magnetic substance. A tunneling magnetoresistive (TMR) element is an example of an element conventionally used for performing information storage operation. Each cell of a magnetic memory, capable of storing one bit of information, is made of one each TMR element and metal-oxide-semiconductor (MOS) transistor.

Figure 16:
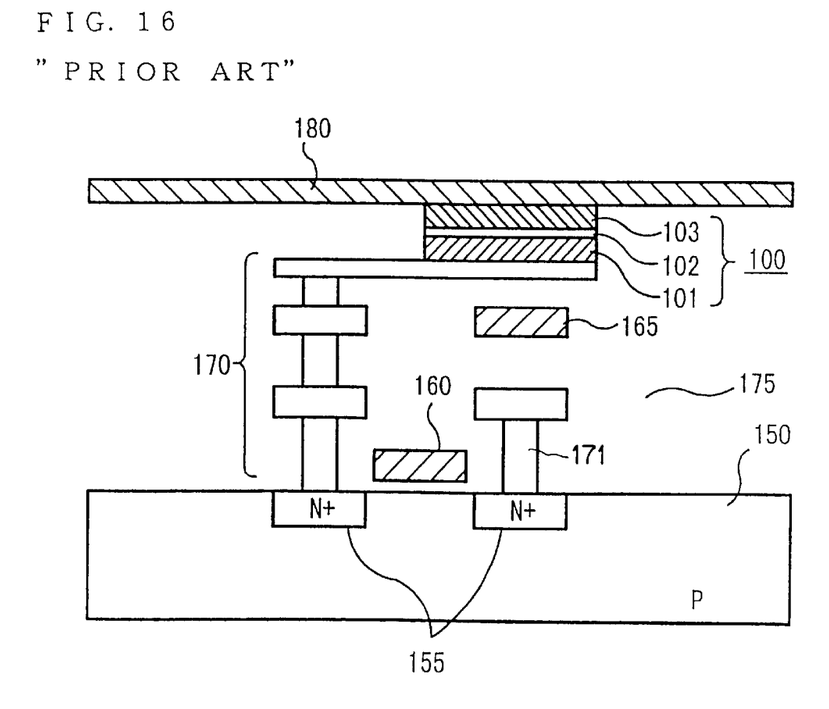
FIG. 16 is a cross-sectional diagram showing the construction of a conventional MRAM device.

FIG. 16 is a cross-sectional diagram showing the construction of a conventional MRAM device. In this Figure, designated by the numeral 100 is a TMR element having a sandwich structure with a thin insulator layer 102 sandwiched between a first magnetic substance layer 101 and a second magnetic substance layer 103. Designated by the numeral 150 is a semiconductor substrate (hereinafter referred to simply as the substrate) on which an access transistor, which is a MOS transistor, is formed, and designated by the numeral 155 are source/drain regions of the access transistor. Designated by the numeral 160 is a readout word line which serves as a gate electrode of the access transistor and designated by the numeral 165 is its write word line. Designated by the numeral 170 is an electrode section for connecting one of the source/drain regions 155 to the first magnetic substance layer 101, designated by the numeral 171 is another electrode section of the other source/drain region 155, designated by the numeral 175 is an interlayer insulator stacked between the individual layers, and designated by the numeral 180 is a bit line. In this structure, the first magnetic substance layer 101 forms a free-spin layer in which the direction of electron spin is unfixed and variable while the second magnetic substance layer 103 forms a fixed-spin layer in which the direction of electron spin is fixed to a specific direction. Since the sandwich structure of the TMR element 100 has a rectangular shape in top view that is elongate in the direction of the bit line 180, the spin direction in the first magnetic substance layer 101 could easily become parallel to the direction of the bit line 180 (bit line direction). The spin direction in the second magnetic substance layer 103 is fixed to this bit line direction.

Figure 17:
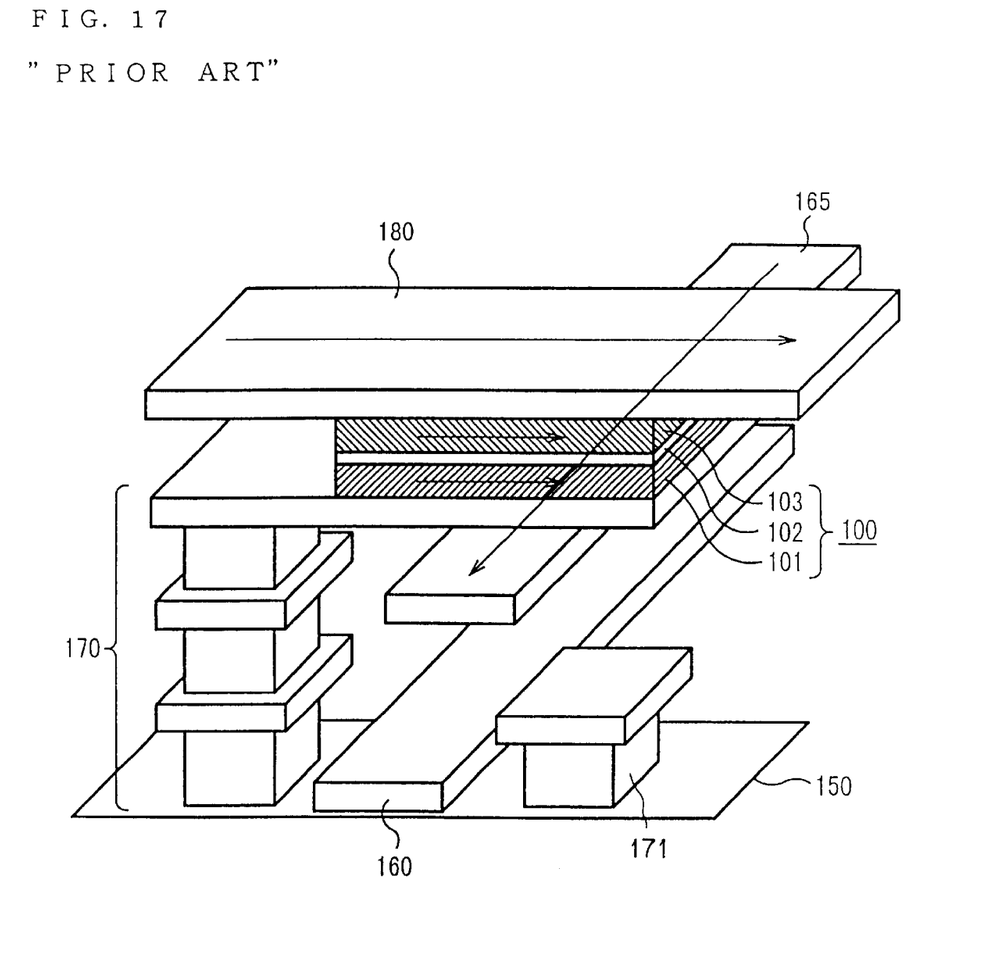
FIG. 17 is a diagram showing the operation of the conventional MRAM device.

Storage (writing) of data into the TMR element 100 of the aforementioned conventional MRAM device is performed by producing flows of electric currents through the bit line 180 and the write word line 165 and determining the spin direction in the first magnetic substance layer 101 which forms a free-spin layer with the aid of magnetic fields generated by the electric currents, as shown in FIG. 17. Specifically, a binary "1" or a binary "0" is written in the TMR element 100 depending on whether the spin direction in the first magnetic substance layer 101 is the same (parallel) as or opposite (antiparallel) to that in the second magnetic substance layer 103. This data write operation requires a specific magnetic field strength to perform. In addition, the data write operation is characterized in that it is carried out in one memory cell where the corresponding bit line 180 and the corresponding write word line 165 intersect each other.

On the other hand, the data stored in the TMR element 100 is read by applying a voltage across the first magnetic substance layer 101 and the second magnetic substance layer 103 and a voltage to the readout word line 160 to turn on the access transistor and then measuring an electric current flowing into the access transistor. The amount of this electric current is large when the spin direction in the first magnetic substance layer 101 is the same as that in the second magnetic substance layer 103, whereas the amount of the electric current is small when the spin direction in the first magnetic substance layer 101 is opposite to that in the second magnetic substance layer 103. This property is used in the execution of data read operation. Specifically, the data in the TMR element 100 is read by varying the electrical resistance between the first magnetic substance layer 101 and the second magnetic substance layer 103, turning on the access transistor, and judging the amount of the electric current flowing from the bit line 180 into the access transistor.

In the aforementioned conventional MRAM device, multiple electrically conductive layers including TMR elements are arranged, forming a multilayer structure with the interlayer insulator 175 or other elements placed between them. In addition, the conventional MRAM device requires separately arranged write word lines and readout word lines. The structure of memory cells which is perpendicular to the plane of the substrate 150 is so complex that its manufacturing processes are complicated and it has been difficult to reduce the area of each cell.

SUMMARY OF THE INVENTION

This invention is intended to provide a solution to the aforementioned problems of the prior art. Accordingly, it is an object of the invention to simplify the structure of memory cells and thereby provide a magnetic random-access memory which enables further miniaturization, a higher level of integration and easier production compared to the prior art.

In a first principal form of the invention, a magnetic random-access memory comprises a semiconductor substrate on which a first word line and a bit line intersecting each other are arranged, a tunneling magnetoresistive element formed in an area of intersection of the first word line and the bit line by stacking a first magnetic substance layer whose magnetization direction is variable, a second magnetic substance layer whose magnetization direction is fixed and an insulator layer placed between the first and second magnetic substance layers, and an access transistor which uses as a gate a second word line extending in a direction intersecting the bit line, wherein the bit line is made of ferromagnetic metal whose magnetization direction is fixed to the longitudinal direction of the bit line, and the bit line acts also as the second magnetic substance layer.

This arrangement of the invention is advantageous in that it serves to simplify the structure of the magnetic random-access memory and facilitate its manufacture.

In one aspect of the invention, the magnetization direction of the bit line is fixed to its longitudinal direction only in its portion where the bit line intersects the first word line.

This makes it possible to easily create unidirectional magnetic domains in which the spin direction is aligned in a single direction as well as to improve the reliability of the magnetic random-access memory.

In a second principal form of the invention, a magnetic random-access memory comprises a semiconductor substrate on which a first word line and a bit line intersecting each other are arranged, a tunneling magnetoresistive element formed in an area of intersection of the first word line and the bit line by stacking a first magnetic substance layer whose magnetization direction is variable, a second magnetic substance layer whose magnetization direction is fixed and an insulator layer placed between the first and second magnetic substance layers, and an access transistor which uses as a gate a second word line extending in a direction intersecting the bit line, wherein the tunneling magnetoresistive element is located in an area of intersection of the second word line and the bit line, and the second word line acts also as the first word line.

This arrangement of the invention is advantageous in that it significantly reduces the complexity involved in creating a multilayer interconnection structure, simplifies the structure and manufacturing processes of the magnetic random-access memory, and enables its miniaturization and a higher level of integration.

In one aspect of the invention, the magnetic random-access memory of the aforementioned second principal form is operated in such a manner that a voltage of a polarity which does not turn on the access transistor is applied to the word line when writing data in the tunneling magnetoresistive element by flowing electric currents through the bit line and the word line, and a voltage is applied to the word line to turn on the access transistor without flowing an electric current through the word line when reading the data from the tunneling magnetoresistive element by flowing an electric current from the bit line to the access transistor.

This makes it possible to perform data read and write operations in a reliable fashion.

In another aspect of the invention, the magnetic random-access memory of the aforementioned second principal form is operated in such a manner that a voltage of a polarity which turns on the access transistor is applied to the word line such that an electric current flows through the word line with a specific voltage gradient when writing data in the tunneling magnetoresistive element by flowing electric currents through the bit line and the word line, whereby the data can be read from the tunneling magnetoresistive element as the data is written therein.

This makes it possible to write the data while verifying that the data is successfully written.

The construction of the magnetic random-access memory of the aforementioned second principal form may be such that one of source/drain regions of the access transistor is connected to the tunneling magnetoresistive element while the other of the source/drain regions is connected to a diffusion layer, which is formed on the semiconductor substrate adjacent to the aforesaid other of the source/drain regions and serves as a well contact for taking out the potential of the semiconductor substrate.

This also makes it possible to reduce the complexity involved in creating a multilayer interconnection structure, simplifies the structure and manufacturing processes of the magnetic random-access memory, and enables its miniaturization and a higher level of integration.

The construction of the magnetic random-access memory of the aforementioned second principal form may be such that a silicide layer bridging surfaces of the diffusion layer serving as the well contact and its adjacent source/drain region is formed by a salicide process.

This further simplifies the structure of the magnetic random-access memory and helps achieve its further miniaturization.

In a third principal form of the invention, a magnetic random-access memory comprises a semiconductor substrate on which a first word line and a bit line intersecting each other are arranged, a tunneling magnetoresistive element formed in an area of intersection of the first word line and the bit line by stacking a first magnetic substance layer whose magnetization direction is variable, a second magnetic substance layer whose magnetization direction is fixed and an insulator layer placed between the first and second magnetic substance layers, and an access transistor which uses as a gate a second word line extending in a direction intersecting the bit line, wherein the first and second word lines are electrically connected to each other.

This arrangement makes it possible to apply control operation used in a structure employing a common word line which serves both as the first and as the second word lines.

In a fourth principal form of the invention, a magnetic random-access memory comprises a semiconductor substrate on which a word line and a bit line intersecting each other are arranged, a tunneling magnetoresistive element formed in an area of intersection of the word line and the bit line by stacking a first magnetic substance layer whose magnetization direction is variable, a second magnetic substance layer whose magnetization direction is fixed and an insulator layer placed between the first and second magnetic substance layers, and a diode having a pn junction and connected to the tunneling magnetoresistive element, wherein data stored in the tunneling magnetoresistive element is read by flowing an electric current from the bit line through the diode.

Since the access transistor is not needed in this arrangement, it is possible to even more simplify the structure of the magnetic random-access memory and achieve its further miniaturization and a higher level of integration.

The construction of the magnetic random-access memory of the aforementioned fourth principal form may be such that the diode is formed of a well region of a first conductivity type created in the semiconductor substrate and a diffusion layer of a second conductivity type created within the well region and connected to the tunneling magnetoresistive element, wherein the data stored in the tunneling magnetoresistive element is read by flowing the electric current from the bit line through the diode in its forward direction.

This makes it possible to realize a simplified structure requiring no access transistor in a reliable fashion.

The construction of the magnetic random-access memory of the aforementioned fourth principal form may be such that the diode is formed of the first magnetic substance layer and a conductor layer which forms a Schottky junction or a metal-to-metal pn junction together with the first magnetic substance layer, wherein the data stored in the tunneling magnetoresistive element is read by flowing the electric current between the bit line and the diode in its reverse direction overwhelming a junction breakdown voltage.

This also makes it possible to realize a simplified structure requiring no access transistor in a reliable fashion.

The construction of the magnetic random-access memory of the aforementioned fourth principal form may be such that the word line is located above the bit line.

This serves to increase the degree of freedom in device pattern design and achieve its further miniaturization and an even higher level of integration.

These and other objects, features and advantages of the invention will become more apparent upon reading the following detailed description in conjunction with the accompanying drawings.

DETAILED DESCRIPTION OF THE PREFERRED EMBODIMENTS OF THE INVENTION

First Embodiment

Figure 1:
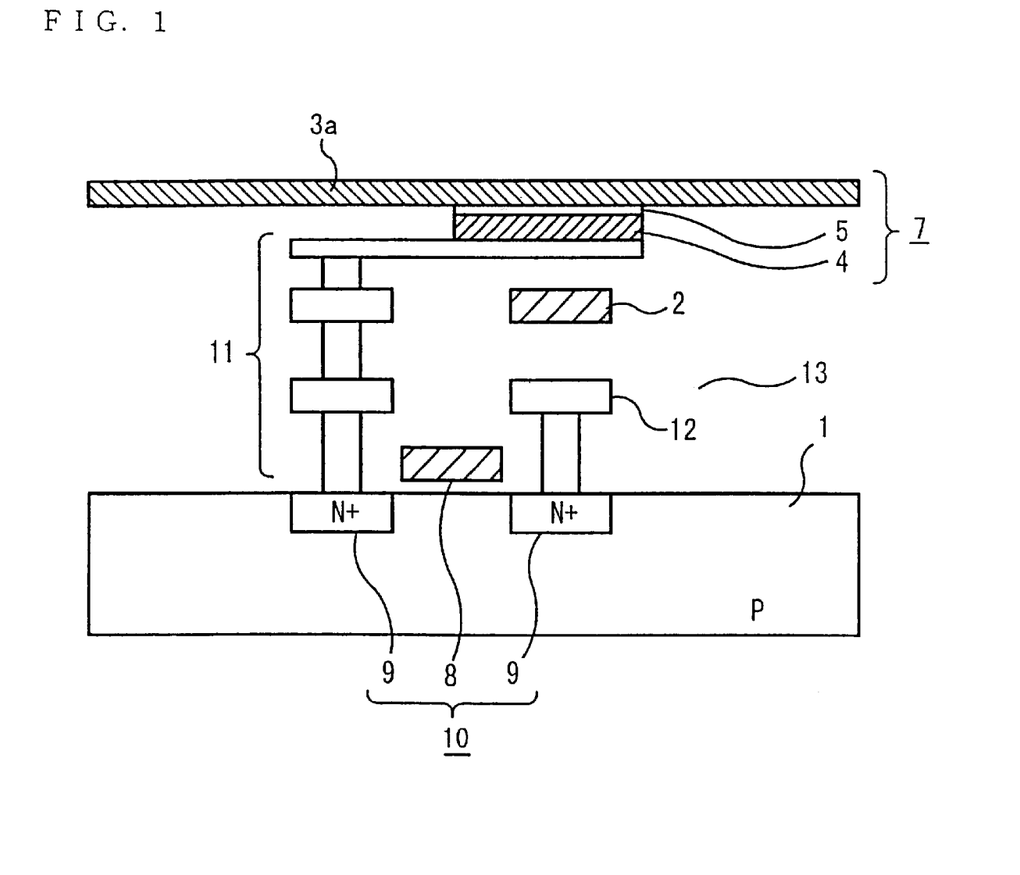
FIG. 1 is a cross-sectional diagram showing the construction of an MRAM device according to a first embodiment of the invention.

FIG. 1 is a cross-sectional diagram showing the construction of an MRAM device according to a first embodiment of the invention.

Referring to FIG. 1, the MRAM device comprises a p-type semiconductor substrate 1 (hereinafter referred to simply as the substrate 1), on which parallel write word lines 2 serving as first word lines and parallel bit lines 3a are arranged at specific intervals, the write word lines 2 and the bit lines 3a intersecting one another. A free-spin layer 4 serving as a first magnetic substance layer and a thin insulator layer 5 stacked on top of the free-spin layer 4 are located in each area of intersection of the write word lines 2 and the bit lines 3a. The bit lines 3a are made of ferromagnetic metal, such as cobalt, nickel or iron. The direction of electron spin in the individual bit lines 3a is fixed to the direction of their length by previously subjecting them to a strong magnetic field or applying other form of treatment. TMR elements 7 are formed at individual intersections of the write word lines 2 and the bit lines 3a, each TMR element 7 having a sandwich structure comprising the bit line 3a, the insulator layer 5 and the free-spin layer 4 from top to bottom.

Underneath the TMR elements 7, readout word lines 8 serving as second word lines are formed on a gate oxide layer which is formed on the substrate 1, wherein the readout word lines 8 run in a direction intersecting the bit lines 3a one another. The readout word line 8, which serves as a gate electrode, and source/drain regions 9 formed on both sides of the readout word line 8 together constitute an access transistor 10. One of the source/drain regions 9 is connected to the free-spin layer 4 via an electrode section 11. In FIG. 1, designated by the numeral 12 is an electrode layer connected to the other of the source/drain regions 9 and designated by the numeral 13 is an interlayer insulator stacked between the individual layers.

Since the sandwich structure of the TMR element 7 has a rectangular shape in top view that is elongate in the direction of the bit line 3a, the variable spin direction in the free-spin layer 4 could be easily made parallel to the bit line direction. As the bit line 3a is made of the ferromagnetic metal and the spin direction in the bit line 3a is fixed to its longitudinal direction as stated above, each portion of the bit line 3a immediately overlying the free-spin layer 4 is used as a fixed-spin layer of the TMR element 7.

In the MRAM device thus constructed, storage (writing) of data into the TMR element 7 is performed by producing flows of electric currents through the bit line 3a and the write word line 2 and determining the spin direction in the free-spin layer 4 with the aid of magnetic fields generated by the electric currents in the same fashion as the prior art. Specifically, a binary "1" or a binary "0" is written in the relevant TMR element 7 depending on whether the spin direction in the free-spin layer 4 is the same as or opposite to that in the bit line 3a. This data write operation requires a specific magnetic field strength to perform. In addition, the data write operation is carried out in one memory cell where the corresponding bit line 3a and the corresponding write word line 2 intersect each other.

On the other hand, the data stored in the TMR element 7 is read by applying a voltage across the free-spin layer 4 and the bit line 3a and a voltage to the readout word line 8 to turn on the access transistor 10 and then measuring an electric current flowing into the access transistor 10. The amount of this electric current is large when the spin direction in the free-spin layer 4 is the same as that in the bit line 3a, whereas the amount of the electric current is small when the spin direction in the free-spin layer 4 is opposite to that in the bit line 3a. This property is used in the execution of data read operation. Specifically, the data in the TMR element 7 is read by varying the electrical resistance between the free-spin layer 4 and the bit line 3a, turning on the access transistor 10, and judging the amount of the electric current flowing from the bit line 3a into the access transistor 10.

Since the bit line 3a is made of the ferromagnetic metal and the spin direction in the bit line 3a is fixed to its longitudinal direction as stated above, it is possible to use the portion of the bit line 3a immediately overlying the free-spin layer 4 as the fixed-spin layer of the TMR element 7 and thereby eliminate the need to create a dedicated fixed-spin layer. It is obvious that this serves to simplify the structure of the MRAM device as well as its manufacturing processes.

Figure 2:
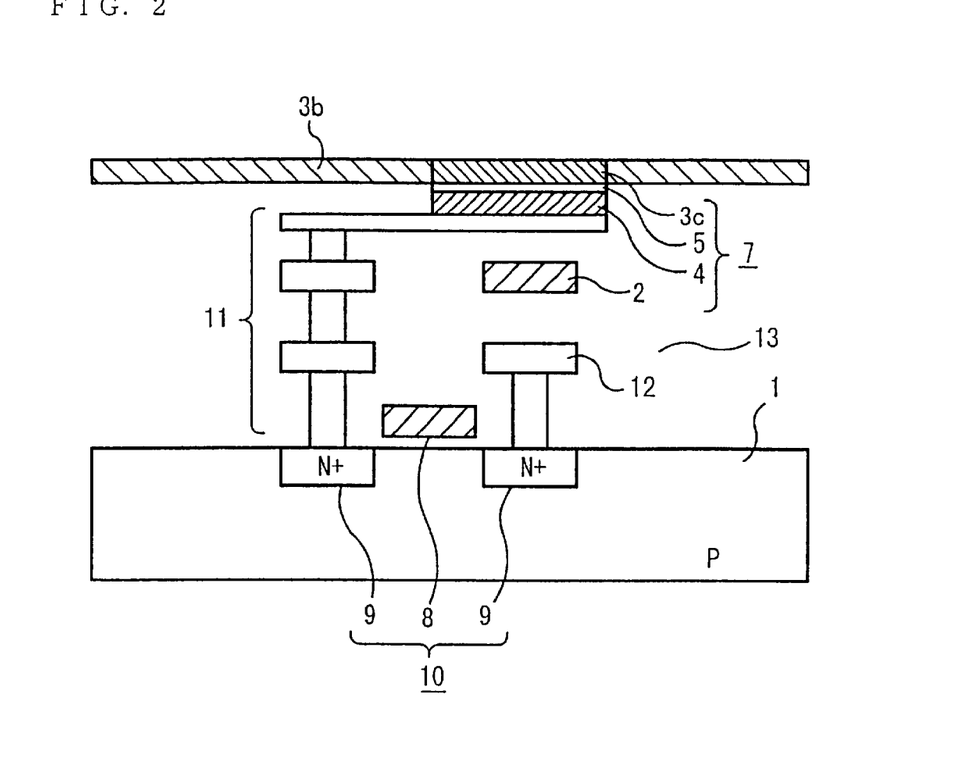
FIG. 2 is a cross-sectional diagram showing the construction of an MRAM device in one variation of the first embodiment.

The spin direction in each bit line 3a need not necessarily be fixed to a single direction all along its length. As an example, the spin direction in the bit line 3a may be fixed to a single direction only in those portions which immediately overlie the free-spin layers 4 (and are used as fixed-spin layers 3c), as shown in FIG. 2. This variation of the foregoing embodiment makes it easier to create unidirectional magnetic domains in which the spin direction is aligned in the single direction, as well as to improve the reliability of the device.

Second Embodiment

While the aforementioned first embodiment requires the separately formed write word lines 2 and readout word lines 8, an MRAM device of a second embodiment employs word lines which are used for performing both data read and write operations.

Figure 3:
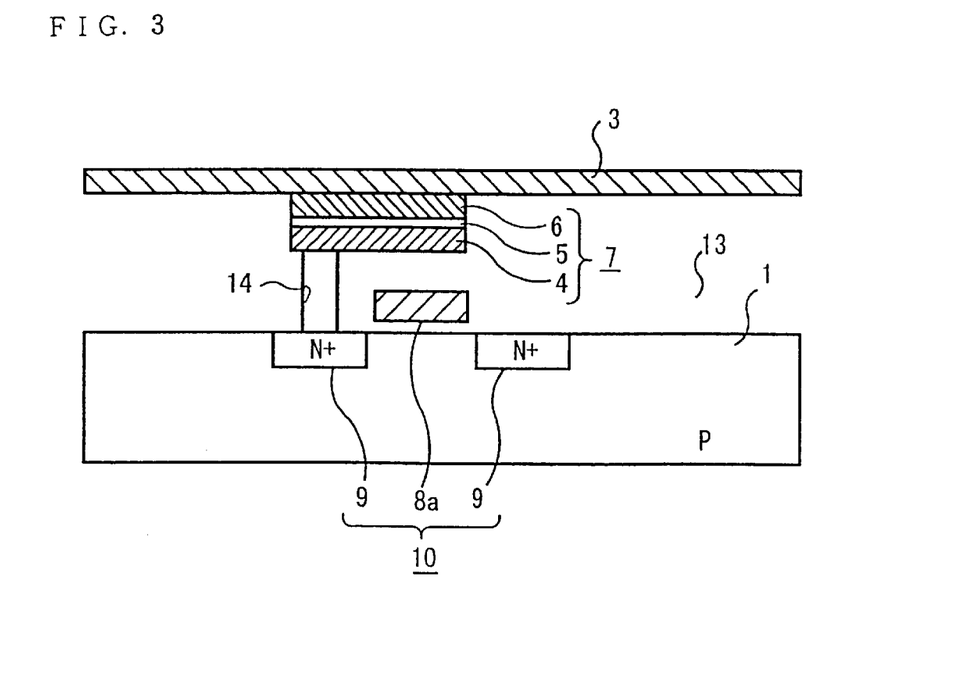
FIG. 3 is a cross-sectional diagram showing the construction of an MRAM device according to a second embodiment of the invention.

Referring to FIG. 3, the MRAM device has common word lines 8a which perform the read and write operations and serve as gate electrodes of individual access transistors 10. TMR elements 7 are arranged at individual intersections of bit lines 3 formed in an upper layer and the common word lines 8a, each TMR element 7 having a sandwich structure comprising a fixed-spin layer 6 serving as a second magnetic substance layer, an insulator layer 5 and a free-spin layer 4 from top to bottom. Designated by the numeral 14 is a contact hole used for connecting the free-spin layer 4 to one of source/drain regions 9.

In this example, a dedicated magnetic substance layer in which the spin direction is fixed to the bit line direction is used to form fixed-spin layers 6, and the bit lines 3 of an ordinary type made of polysilicon or aluminum, for example, are formed on top of the fixed-spin layers 6.

The aforementioned common word line 8a is used not only for writing data determined by the spin direction in the free-spin layer 4 into the TMR element 7 but also for turning on the access transistor 10 of each memory cell. Since the common word line 8a is used as the gate electrode of each access transistor 10 and as a write word line in the structure of this embodiment as stated above, the TMR element 7 is located above and at a relatively close distance from the access transistor 10, so that the height of the TMR element 7 as measured from a substrate 1 can be reduced. The above-described second embodiment is characterized in that it is easy to make the contact hole 14 for connecting the free-spin layer 4 to the substrate 1 and it is not necessary to form the electrode section 11 involving a rather complex multilayer interconnection structure unlike the first embodiment illustrated in FIG. 1.

It would be appreciated from the foregoing discussion that the second embodiment significantly reduces the complexity involved in creating the multilayer interconnection structure, simplifies the overall structure and manufacturing processes of the MRAM device, and enables its further miniaturization and a higher level of integration.

Figure 4:
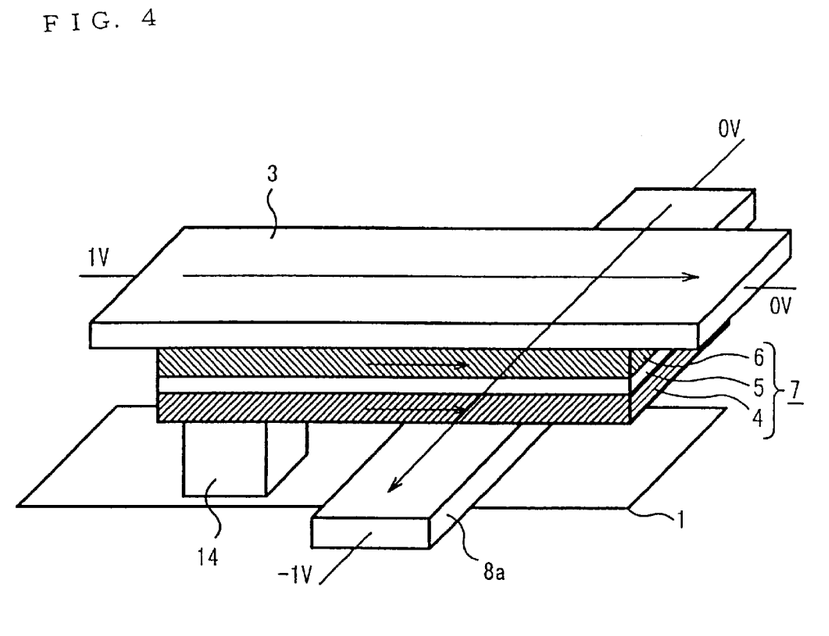
FIG. 4 is a diagram showing how the MRAM device of the second embodiment performs data write operation.
Figure 5:
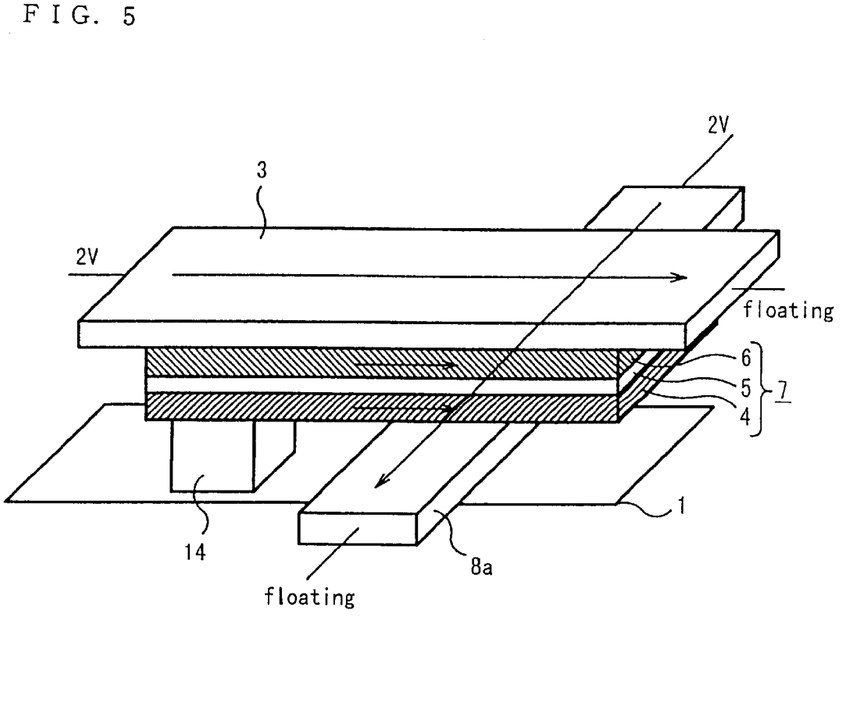
FIG. 5 is a diagram showing how the MRAM device of the second embodiment performs data read operation.
Figure 6:
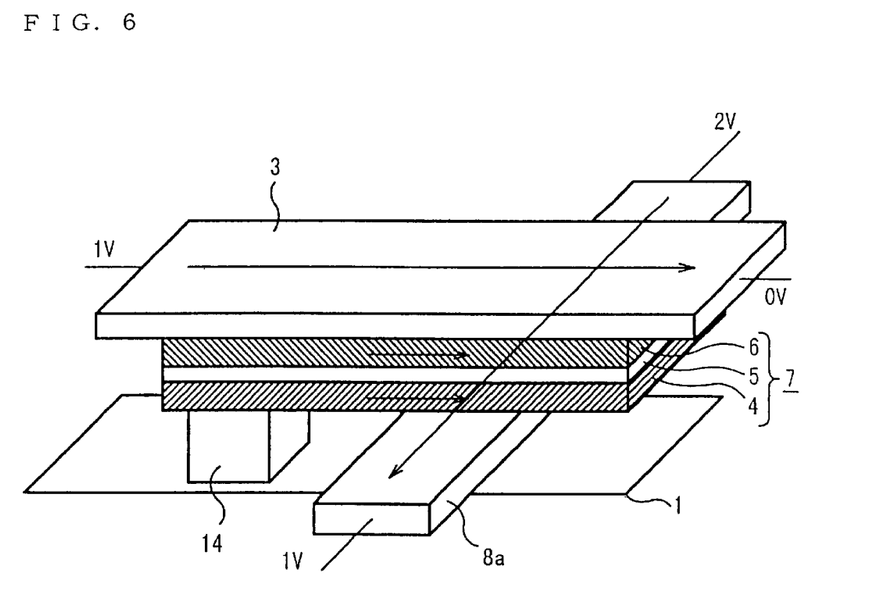
FIG. 6 is a diagram showing how the MRAM device of the second embodiment performs simultaneous data read/write operation.

The data read and write operations performed by the MRAM device of this embodiment are now described referring to FIGS. 4 to 6.

FIG. 4 is a diagram showing one of areas where the bit lines 3 intersect the common word lines 8a for explaining how the MRAM device of the second embodiment performs the data write operation.

To execute the data write operation, an electric current is caused to flow through the common word line 8a by producing a potential difference between both ends of the common word line 8a to generate a magnetic field of a specific strength or above to thereby determine the spin direction in the free-spin layer 4. The potential difference is produced by applying a negative voltage to the common word line 8a in order that the access transistor 10 is not turned on. Data is written in the relevant TMR element 7 with the aid of an electric current flowing through the bit line 3 (represented by 1V, 0V) and the electric current flowing through the common word line 8a with the access transistor 10 held in an off state. In the illustrated example, −1V is applied to one end of the common word line 8a while setting the other end to 0V such that the resultant potential difference does not cause the access transistor 10 to turn on.

FIG. 5 shows how the MRAM device of the second embodiment performs the data read operation, in which a voltage is applied to the common word line 8a with one end of the common word line 8a floated or set to the same potential as the other end. This arrangement serves to reduce the electric current flowing through the common word line 8a to a minimum, or even to zero value, so as not to generate a magnetic field of the specific strength or above. In the data read operation, a positive voltage is applied to the common word line 8a. In the illustrated example, 2V is applied to one end of the common word line 8a while floating the other end so that the access transistor 10 turns on. A positive voltage is applied to one end of the bit line 3 and the stored data is read by detecting an electric current flowing from the bit line 3 (represented by 2V, floating) into the access transistor 10 through the TMR element 7.

FIG. 6 is a diagram showing how the MRAM device of the second embodiment performs simultaneous data read/write operation. In this operation, an electric current is flown through the common word line 8a while keeping the entire common word line 8a at a positive potential and producing a potential difference that is sufficient to generate a magnetic field of the specific strength or above between both ends of the common word line 8a. In the illustrated example, 2V is applied to one end of the common word line 8a and 1V to the other end. since this arrangement holds the access transistor 10 in an on state when data is being written in the TMR element 7 with the aid of electric currents flowing through the bit line 3 (represented by 1V, 0V) and the common word line 8a, it is possible to write the data while verifying that the data is successfully written.

While the present embodiment employs the separate fixed-spin layer 6 and bit line 3, this structure may be modified such that the bit line 3 serves also as the fixed-spin layer by using the structure of the first embodiment. This variation of the second embodiment would help simplify the structure of the MRAM device.

Third Embodiment

While the aforementioned second embodiment employs the common word lines 8a which perform both the data read and write operations, it might be impossible to implement this kind of common word lines 8a combining the functions of the write word lines 2 and the readout word lines 8 in modern hybrid design in which the MRAM device is integrated with a multilayer interconnection logic device, for instance. Since interconnection layers are stacked so higher than the substrate 1 in the modern multilayer interconnection logic device, there is no alternative but to form the TMR element 7 at a position much higher than the readout word line 8 of the access transistor 10, making it impossible to combine the write word line 2 and the readout word line 8 into a common word line.

Figure 7:
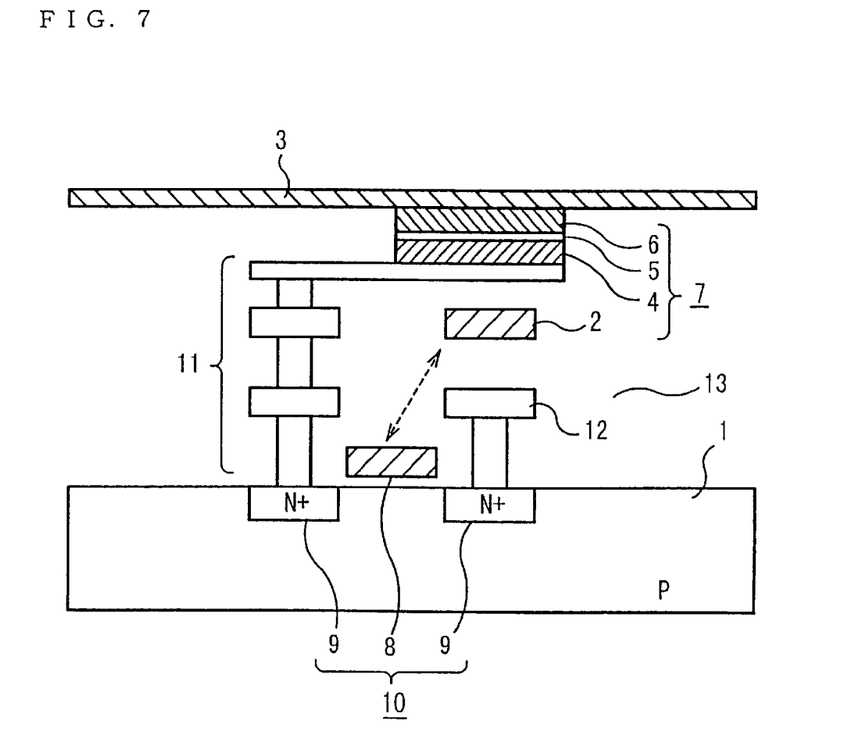
FIG. 7 is a cross-sectional diagram showing the construction of an MRAM device according to a third embodiment of the invention.
Figure 8:
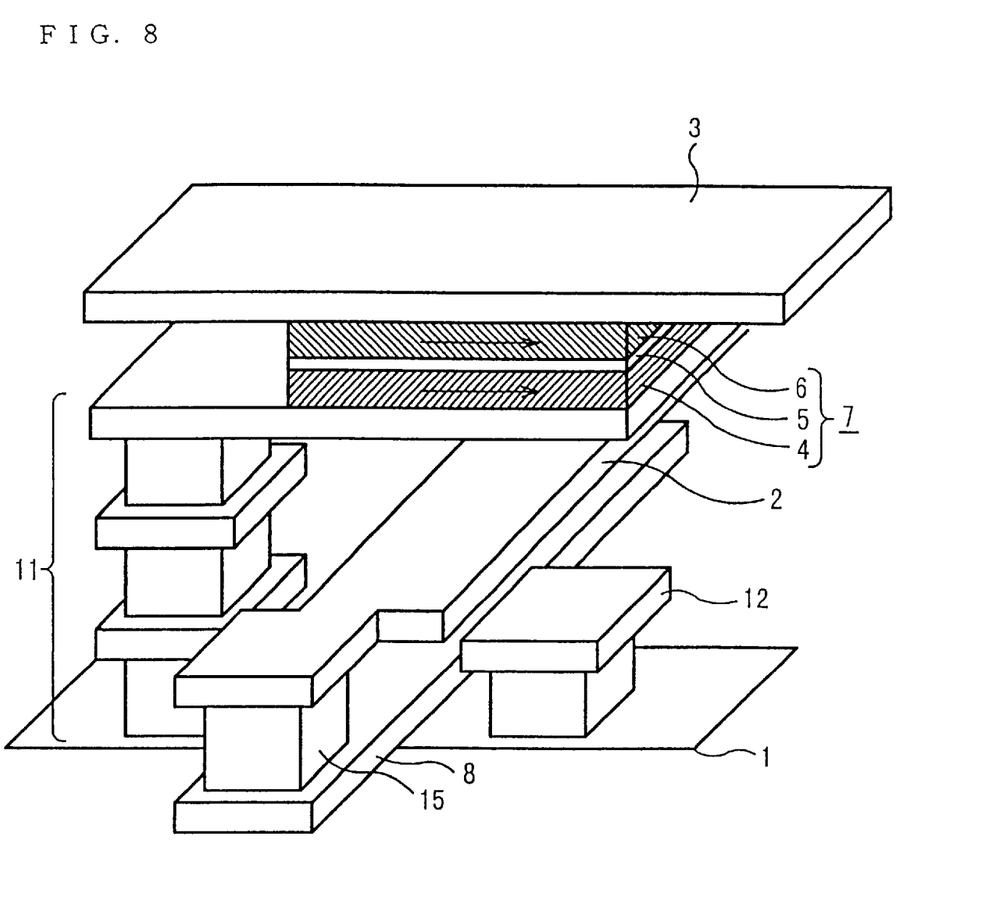
FIG. 8 is a perspective diagram illustrating the construction of the MRAM device according to the third embodiment.

FIG. 7 shows the construction of an MRAM device according to a third embodiment of the invention, in which a write word line 2 and a readout word line 8 are electrically connected to each other to set them at the same potential such that the same control operation as described with reference to the second embodiment becomes possible. Specifically, the write word line 2 and the readout word line 8 are connected by an interconnect element 15, such as a contact hole, provided at an end of a cell array as shown in FIG. 8. This arrangement makes it possible to perform the data read/write operation described in the second embodiment even when the MRAM device is provided with the separate write word line 2 and readout word line 8.

Fourth Embodiment

In the structure of the MRAM device of the first embodiment, it is necessary that one of the source/drain regions 9 which is not connected to the TMR element 7 be taken out to the exterior of a cell array by forming the electrode layer 12 (FIG. 1).

Figure 9:
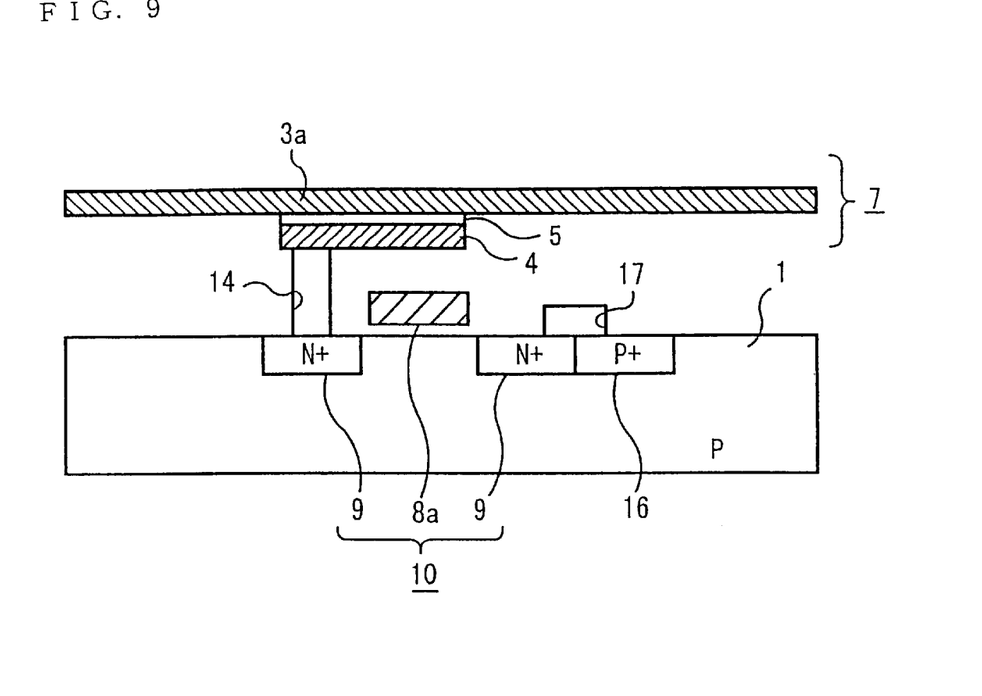
FIG. 9 is a cross-sectional diagram showing the construction of an MRAM device according to a fourth embodiment of the invention.

In an MRAM device according to a fourth embodiment of the invention illustrated in FIG. 9, a $p^+$ diffusion layer 16 (hereinafter referred to as a well contact 16) for taking out the potential of a substrate 1 is formed adjacent to one of source/drain regions 9 of an access transistor 10 and a contact hole 17 bridging surfaces of the well contact 16 and the aforesaid one of the source/drain regions 9 is formed, whereby the well contact 16 and the aforesaid one of the source/drain regions 9 are interconnected. In this structure, it is possible to judge the resistance value of a TMR element 7 from the value of a current flowing between a bit line 3 and the substrate 1.

This embodiment is advantageous in that it makes the electrode layer 12 for taking out one of the source/drain regions 9 to the exterior of the cell array unnecessary and reduces the height of interconnection layers.

Figure 10:
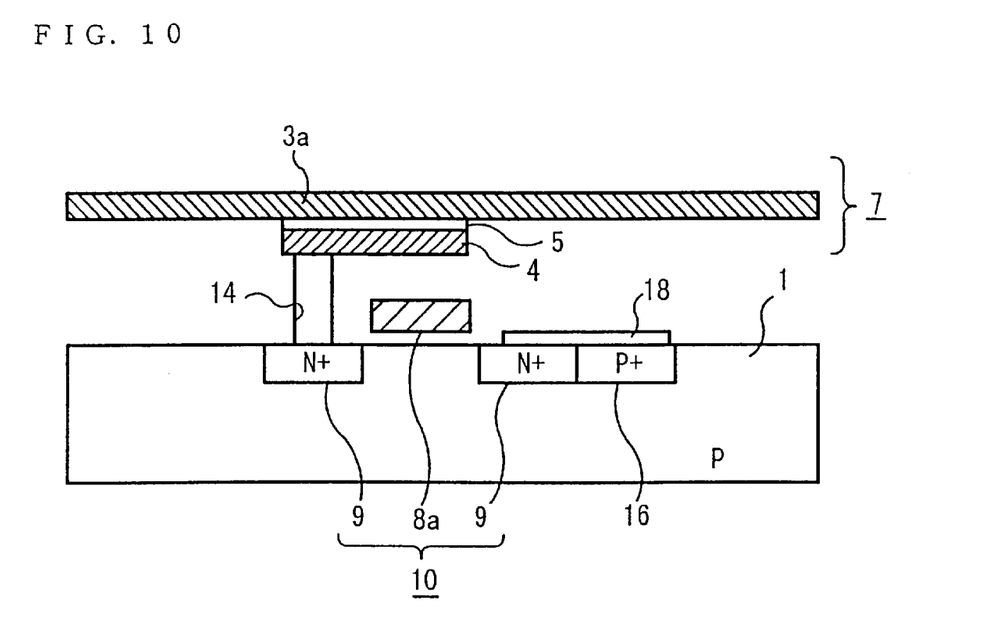
FIG. 10 is a cross-sectional diagram showing the construction of an MRAM device in one variation of the fourth embodiment.

The structure of the fourth embodiment may be modified as illustrated in FIG. 10, in which a silicide layer 18 containing tungsten or titanium, for instance, is formed by a salicide process, the silicide layer 18 bridging surfaces of the well contact 16 and the aforesaid one of the source/drain regions 9, so that the well contact 16 and the aforesaid one of the source/drain regions 9 are interconnected. This variation of the fourth embodiment is advantageous in that the silicide layer 18 can be easily formed and helps achieve further miniaturization of the MRAM device.

Fifth Embodiment

While the access transistors 10 are formed in the MRAM devices of the aforementioned first to fourth embodiments, junctions formed on a substrate 1 may be substituted for the access transistors 10.

Figure 11:
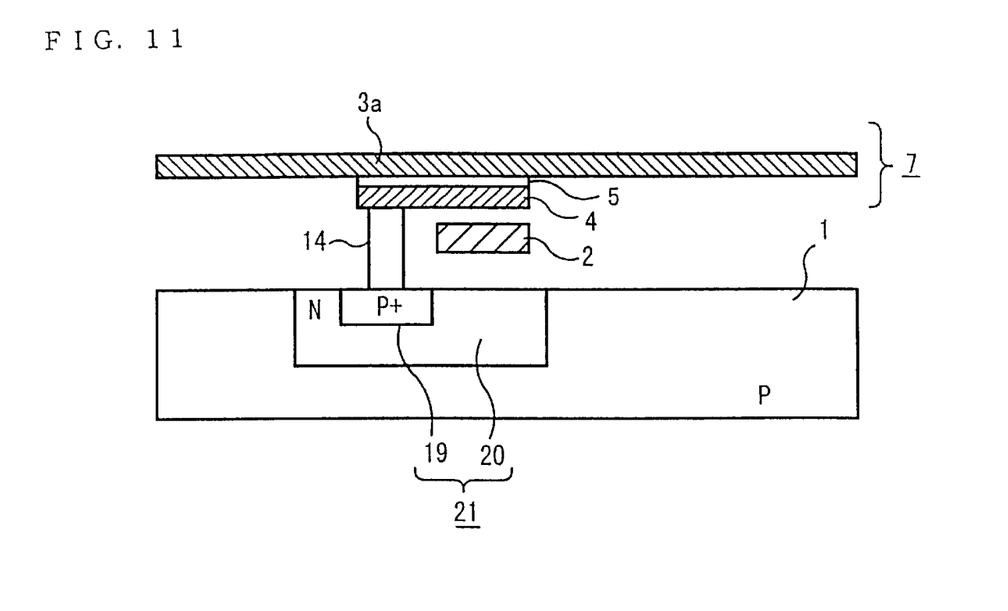
FIG. 11 is a cross-sectional diagram showing the construction of an MRAM device according to a fifth embodiment of the invention.

FIG. 11 is a cross-sectional diagram showing the construction of an MRAM device according to a fifth embodiment of the invention. The TMR element 7 is formed as in the first embodiment and will not be discussed further. As depicted in the Figure, a $p^+$ diffusion layer 19 is formed within an n-well 20 serving as a well region formed in a p-type substrate 1, and the $p^+$ diffusion layer 19 and a free-spin layer 4 are interconnected by a contact hole 14. This structure just requires write word lines 2 as word lines, and since each write word line 2 does not function as a transistor gate, it is not necessary to form them close to the substrate 1.

While data write operation performed by this MRAM device is the same as that of the second embodiment, data read operation is performed by measuring an electric current flowing from a bit line 3a into the n-well 20 in this embodiment. When reading information from a TMR element 7, a pn junction formed between the $p^{30}$ diffusion layer 19 and the n-well 20 acts as a diode 21 which excludes the possibility of picking up information stored in other TMR elements 7 connected to the same bit line 3a.

Figure 12A:
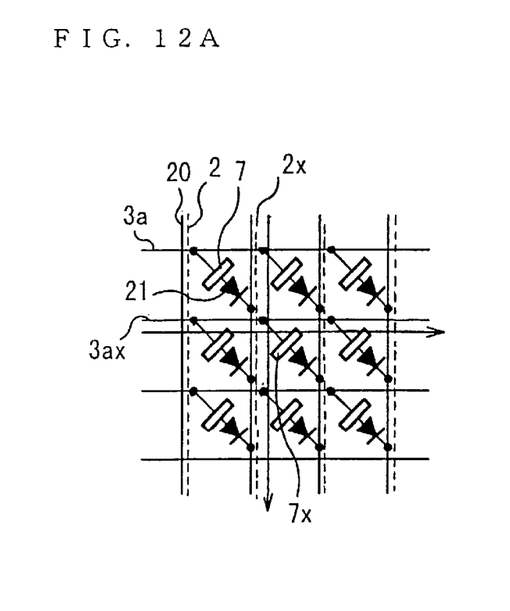
FIGS. 12A and 12B are diagrams showing how the MRAM device of the fifth embodiment performs data read and write operations.
Figure 12B:
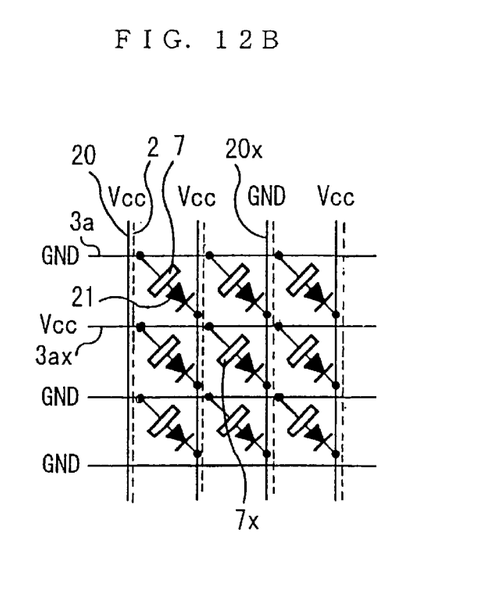

The data read and write operations performed by the MRAM device of this embodiment are now described in further detail referring to FIGS. 12A and 12B.

The data write operation is performed by causing electric currents to flow through a selected bit line 3ax and a selected write word line 2x and thereby writing data in a TMR element 7x located at their intersection as shown in FIG. 12A. In executing the data read operation depicted in FIG. 12B, on the other hand, only a selected n-well 20x connected to the TMR element 7x is connected to ground potential and a source voltage is applied to the other n-wells 20. Also, the source voltage is applied to the selected bit line 3ax connected to the TMR element 7x and the other bit lines 3a is connected to the ground potential. As a result, an electric current flows only into the selected n-well 20x through the corresponding TMR element 7x in the forward direction of the diode 21, whereby the data stored in the TMR element 7x is read out.

Since the access transistors 10 are eliminated in the MRAM device of this embodiment, areas needed on the substrate 1 can be correspondingly reduced, resulting in a reduction in the area of each memory cell.

Figure 13:
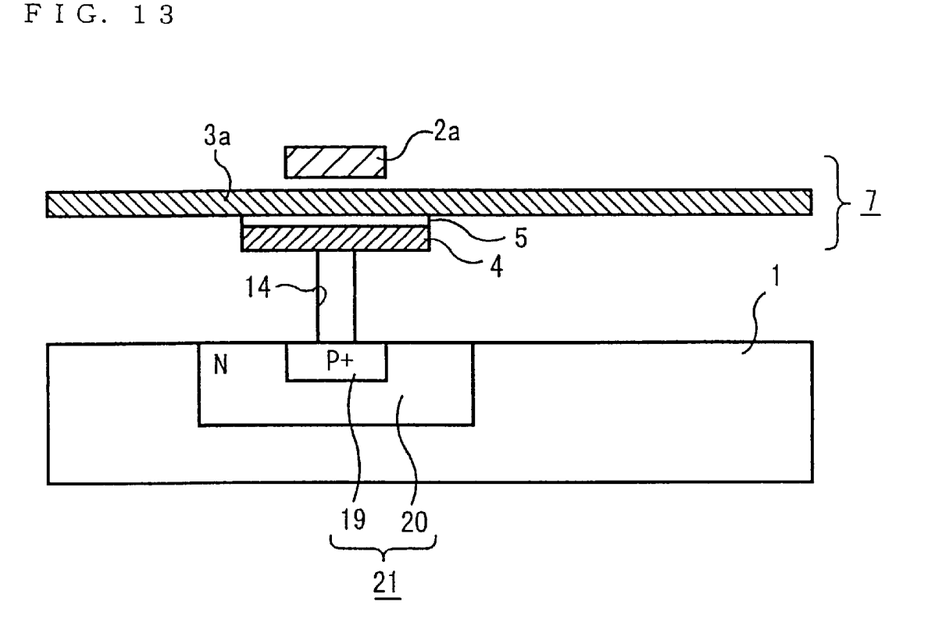
FIG. 13 is a cross-sectional diagram showing the construction of an MRAM device in one variation of the fifth embodiment.

Since the write word lines 2 are not used in the data read operation, each write word line 2a may be located above the bit line 3a as shown in FIG. 13. In this varied form of the fifth embodiment, it is not necessary to keep a distance between the write word line 2a and the contact hole 14 for preventing short circuit.

Sixth Embodiment

Figure 14:
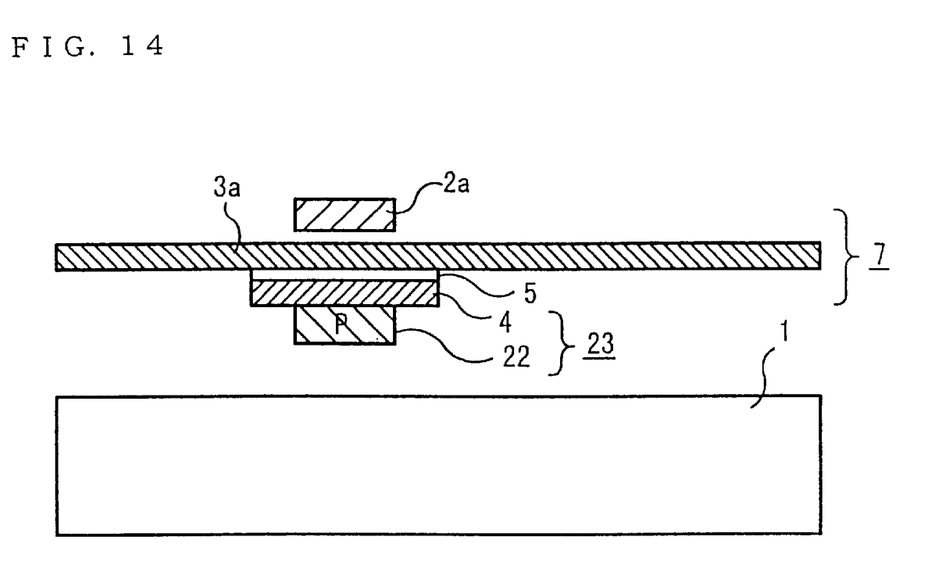
FIG. 14 is a cross-sectional diagram showing the construction of an MRAM device according to a sixth embodiment of the invention.

FIG. 14 is a cross-sectional diagram showing the construction of an MRAM device according to a sixth embodiment of the invention. While the $p^{30}$ diffusion layer 19 and the n-well 20 are created to form a pn junction in each cell on the substrate 1 in the fifth embodiment described above, a polysilicon layer 22 is formed above a substrate 1 and a free-spin layer 4 is formed on top of the polysilicon layer 22, thereby forming a Schottky junction between the polysilicon layer 22 and the free-spin layer 4, in the sixth embodiment. The polysilicon layer 22 is doped to make it positive (p-type).

Figure 15A:
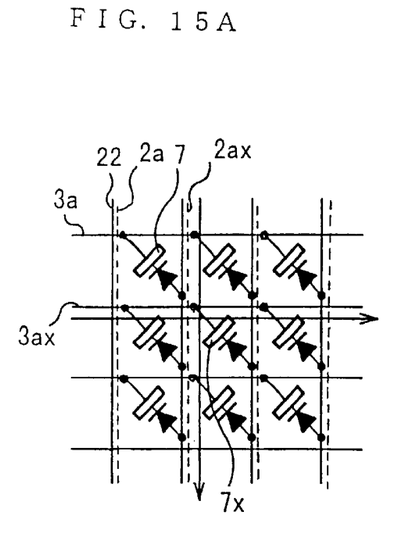
FIGS. 15A and 15B are diagrams showing how the MRAM device of the sixth embodiment performs data read and write operations.
Figure 15B:
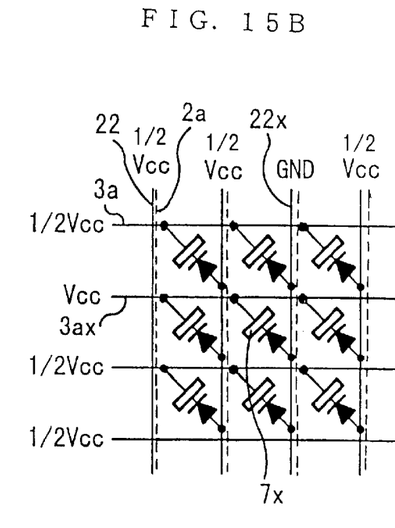

Data read and write operations performed by the MRAM device of this embodiment are now described referring to FIGS. 15A and 15B. It is to be noted that the Schottky junction formed between the polysilicon layer 22 and the free-spin layer 4 acts as a diode 23 which excludes the possibility of picking up information stored in other TMR elements 7 connected to the same bit line 3a in the data write operation and its breakdown voltage is set between half the source voltage and the source voltage.

The data write operation is performed by causing electric currents to flow through a selected bit line 3ax and a selected write word line 2ax and thereby writing data in a TMR element 7x located at their intersection as shown in FIG. 15A. In executing the data read operation depicted in FIG. 15B, on the other hand, only a selected polysilicon layer 22x connected to the TMR element 7x is connected to ground potential and half the source voltage is applied to the other polysilicon layers 22. Also, the source voltage is applied to the selected bit line 3ax connected to the TMR element 7x and half the source voltage is applied to the other bit lines 3a. As a result, an electric current flows only between the selected bit line 3ax and polysilicon layer 22x through the corresponding TMR element 7x in the reverse direction of the diode 23 overwhelming its breakdown voltage, whereby the data stored in the TMR element 7x is read out. Since the reverse voltage applied to the other TMR elements 7 does not exceed the breakdown voltage, no electric current flows through those TMR elements 7 in either the forward or reverse direction.

While the Schottky junction is formed by forming a polysilicon layer 22 in each TMR element 7 in this embodiment, a metallic layer may be formed instead of the polysilicon layer 22 such that a metal-to-metal junction having a low breakdown voltage is formed between the metallic layer and the free-spin layer 4.

What is claimed is:

1. A magnetic random-access memory comprising:
   a semiconductor substrate on which a first word line and a bit line intersecting each other are arranged;
   a tunneling magnetoresistive element formed in an area of intersection of the first word line and the bit line by stacking a first magnetic substance layer whose magnetization direction is variable, a second magnetic substance layer whose magnetization direction is fixed and an insulator layer placed between the first and second magnetic substance layers; and
   an access transistor which uses as a gate a second word line extending in a direction intersecting the bit line;
   wherein the bit line is made of ferromagnetic metal whose magnetization direction is fixed to the longitudinal direction of the bit line, and the bit line acts also as the second magnetic substance layer.

2. The magnetic random-access memory according to claim 1, wherein the magnetization direction of the bit line is fixed to its longitudinal direction only in its portion where the bit line intersects the first word line.

3. A magnetic random-access memory comprising:
   a semiconductor substrate on which a first word line and a bit line intersecting each other are arranged;
   a tunneling magnetoresistive element formed in an area of intersection of the first word line and the bit line by stacking a first magnetic substance layer whose magnetization direction is variable, a second magnetic substance layer whose magnetization direction is fixed and an insulator layer placed between the first and second magnetic substance layers; and
   an access transistor which uses as a gate a second word line extending in a direction intersecting the bit line;
   wherein the tunneling magnetoresistive element is located in an area of intersection of the second word line and the bit line, and the second word line acts also as the first word line.

4. The magnetic random-access memory according to claim 3, wherein a voltage of a polarity which does not turn on the access transistor is applied to the word line when writing data in the tunneling magnetoresistive element by flowing electric currents through the bit line and the word line, and a voltage is applied to the word line to turn on the access transistor without flowing an electric current through the word line when reading the data from the tunneling magnetoresistive element by flowing an electric current from the bit line to the access transistor.

5. The magnetic random-access memory according to claim 3, wherein a voltage of a polarity which turns on the access transistor is applied to the word line such that an electric current flows through the word line with a specific voltage gradient when writing data in the tunneling magnetoresistive element by flowing electric currents through the bit line and the word line, whereby the data can be read from the tunneling magnetoresistive element as the data is written therein.

6. The magnetic random-access memory according to claim 3, wherein one of source/drain regions of the access transistor is connected to the tunneling magnetoresistive element while the other of the source/drain regions is connected to a diffusion layer, which is formed on the semiconductor substrate adjacent to said other of the source/drain regions and serves as a well contact for taking out the potential of the semiconductor substrate.

7. The magnetic random-access memory according to claim 6, wherein a silicide layer bridging surfaces of the diffusion layer and its adjacent source/drain region is formed by a salicide process.

8. A magnetic random-access memory comprising:
   a semiconductor substrate on which a first word line and a bit line intersecting each other are arranged;
   a tunneling magnetoresistive element formed in an area of intersection of the first word line and the bit line by stacking a first magnetic substance layer whose magnetization direction is variable, a second magnetic substance layer whose magnetization direction is fixed and an insulator layer placed between the first and second magnetic substance layers; and
   an access transistor which uses as a gate a second word line extending in a direction intersecting the bit line;
   wherein the first and second word lines are electrically connected to each other.

9. A magnetic random-access memory comprising:
   a semiconductor substrate on which a word line and a bit line intersecting each other are arranged;
   a tunneling magnetoresistive element formed in an area of intersection of the word line and the bit line by stacking a first magnetic substance layer whose magnetization direction is variable, a second magnetic substance layer whose magnetization direction is fixed and an insulator layer placed between the first and second magnetic substance layers; and
   a diode having a pn junction and connected to the tunneling magnetoresistive element;
   wherein data stored in the tunneling magnetoresistive element is read by flowing an electric current from the bit line through the diode.

10. The magnetic random-access memory according to claim 9, wherein the diode is formed of a well region of a first conductivity type created in the semiconductor substrate and a diffusion layer of a second conductivity type created within the well region and connected to the tunneling magnetoresistive element, and wherein the data stored in the tunneling magnetoresistive element is read by flowing the electric current from the bit line through the diode in its forward direction.

11. The magnetic random-access memory according to claim 9, wherein the diode is formed of the first magnetic substance layer and a conductor layer which forms a Schottky junction or a metal-to-metal pn junction together with the first magnetic substance layer, and wherein the data stored in the tunneling magnetoresistive element is read by flowing the electric current between the bit line and the diode in its reverse direction overwhelming a junction breakdown voltage.

12. The magnetic random-access memory according to claim 9, wherein the word line is located above the bit line.

13. A magnetic random-access memory comprising:

a semiconductor substrate on which a word line and a bit line intersecting each other are arranged;

a tunneling magnetoresistive element formed in an area of intersection of the word line and the bit line by stacking a first magnetic substance layer whose magnetization direction is variable, the bit line acting as a second magnetic substance layer whose magnetization direction is fixed and an insulator layer placed between the first and second magnetic substance layers; and a diode having a pn junction and connected to the tunneling magnetoresistive element;

wherein data stored in the tunneling magnetoresistive element is read by flowing an electric current from the bit line through the diode.

* * * * *